United States Patent
Tanaka et al.

[11] Patent Number: 5,936,416
[45] Date of Patent: Aug. 10, 1999

[54] PROBE INSPECTION APPARATUS

[75] Inventors: Hideaki Tanaka, Nirasaki; Yoshihito Marumo, Yamanashi-Ken, both of Japan

[73] Assignee: Tokyo Electron Limited, Tokyo, Japan

[21] Appl. No.: 08/857,852

[22] Filed: May 16, 1997

[30] Foreign Application Priority Data

May 17, 1996 [JP] Japan .................................. 8-148097

[51] Int. Cl.⁶ ................................................ G01R 31/26
[52] U.S. Cl. ........................ 324/754; 324/765; 324/158.1
[58] Field of Search ................... 324/754, 765, 324/158.1

[56] References Cited

U.S. PATENT DOCUMENTS

| | | | |
|---|---|---|---|
| 5,307,011 | 4/1994 | Tani | 324/158.1 |
| 5,561,386 | 10/1996 | Funaki et al. | 324/754 |
| 5,777,485 | 7/1998 | Tanaka et al. | 324/765 |
| 5,798,651 | 8/1998 | Aruga et al. | 324/754 |

FOREIGN PATENT DOCUMENTS 2-247720  10/1990  Japan .
5-150810   6/1993  Japan .

*Primary Examiner*—Glenn W. Brown
*Attorney, Agent, or Firm*—Oblon, Spivak, McClelland, Maier & Neustadt, P.C.

[57] ABSTRACT

A probe inspection apparatus includes a mounting section mounting an inspection target, a loader section having a convey mechanism for conveying the inspection target on the mounting section, a prober section for inspecting the inspection target conveyed by the convey mechanism, a controller for controlling movements of the prober section and the loader section, and a display unit having a display panel for displaying an operation panel for operating the controller. The operation panel has operation touch keys for operating the controller with an operation content displayed in a user country language, and identification symbol touch keys for displaying an operation content corresponding to the operation keys in a language different from the user country language.

7 Claims, 4 Drawing Sheets

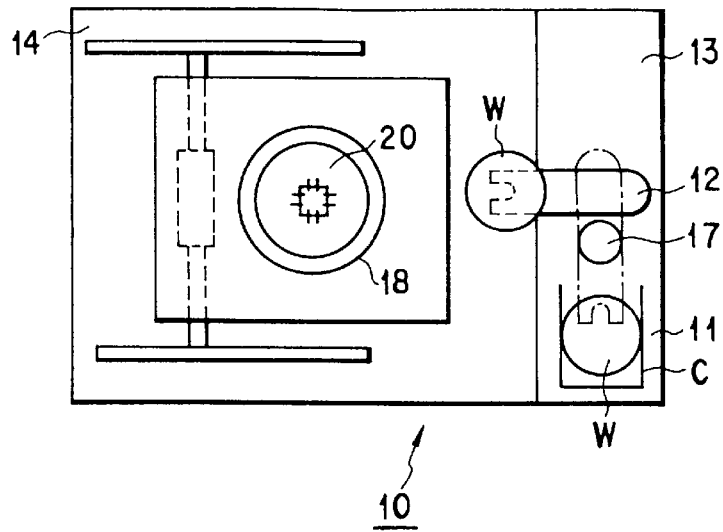
F I G. 3
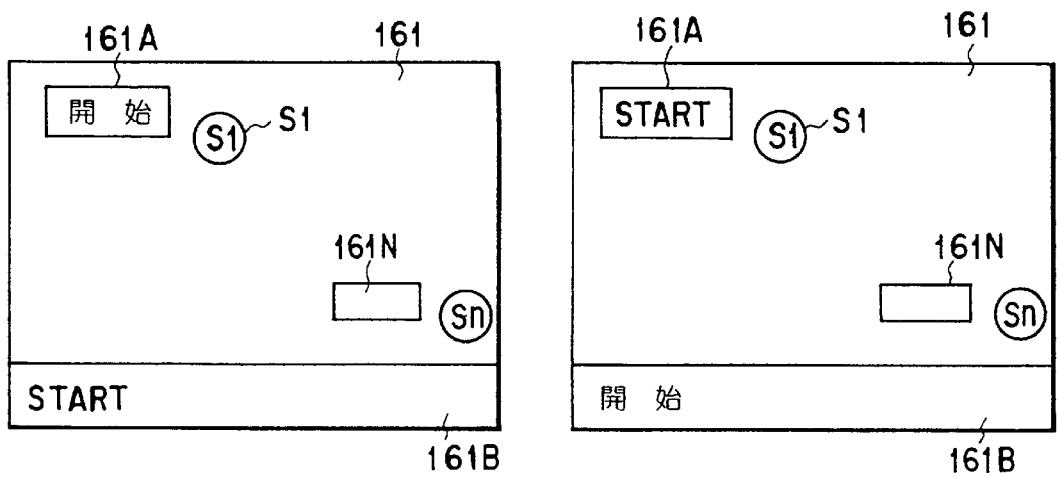
F I G. 4A  F I G. 4B
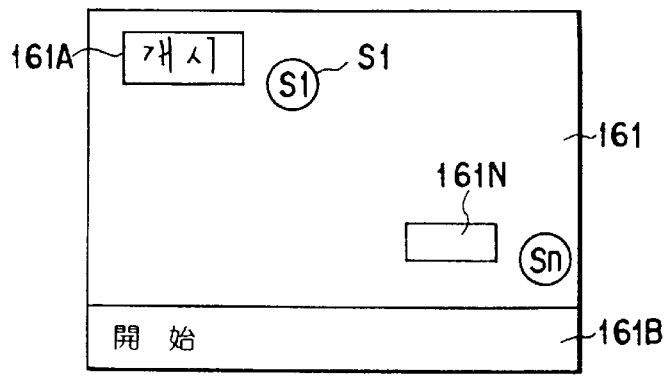
F I G. 4C

PROBE INSPECTION APPARATUS

BACKGROUND OF THE INVENTION

The present invention relates to a probe inspection apparatus which inspects the electrical characteristics of one or a plurality of semiconductor elements, such as IC chips, formed on semiconductor wafers.

A conventional inspection apparatus of this type comprises a cassette mounting section which mounts a cassette storing a plurality of semiconductor wafers thereon, a loader section having tweezers for conveying the semiconductor wafers of the cassette mounting section, a prober section for inspecting the semiconductor wafers conveyed by the tweezers of the loader section, and a controller for controlling the movements of various mechanisms and members of these mounting, loader, and prober sections. The inspection apparatus also comprises a display unit having a display panel or screen which displays the inspection results of semiconductor wafers, the operation status of each of the loader and prober sections, and errors including operator manipulation errors and machine operation errors in this apparatus.

An operation panel or console is displayed on the display panel to operate drive various mechanisms and members through the controller. This inspection apparatus is operated through various operation or touch keys displayed on the operation panel. Each key has an operation content displayed in the language of the user country (the country in which the inspection apparatus is used). The operator can read the operation contents of the operation keys and touch required operation keys to perform various operations.

In the conventional probe inspection apparatus, the display panel is displayed in the language of the user country of this apparatus. For example, if the user country is Korea, the operation contents of the operation keys on the operation panel are displayed in the Hankul alphabet. If Japanese operators try to confirm the progress of inspection of semiconductor wafers, the operation status of each section, and the error status such as an operator manipulation error or machine operation error in order to perform the maintenance of the probe inspection apparatus, most Japanese cannot understand the Hankul alphabet. The operator must confirm the operation contents of the operation keys upon every operation in maintenance. Confirming the contents requires a comparison table or the like corresponding to the display contents. The operator must operate the apparatus in accordance with this comparison table, resulting in a long comparison work time and a long maintenance time. The operator cannot quickly take a maintenance measure such as an error measure.

BRIEF SUMMARY OF THE INVENTION

It is an object of the present invention to provide a probe inspection apparatus which allows the operator to easily and quickly confirm the operation contents of an operation panel displayed on the display panel irrespective of the language used, and therefore to quickly take a maintenance measure such as an error measure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a plan view schematically showing the overall arrangement of the probe inspection apparatus;

FIGS. 4A to 4C are views, respectively, showing examples of an operation panel displayed on a display panel in different countries;

DETAILED DESCRIPTION OF THE INVENTION

A probe inspection apparatus according to an embodiment of the present invention will be described below with reference to the several views of the accompanying drawing.

Figure 1:
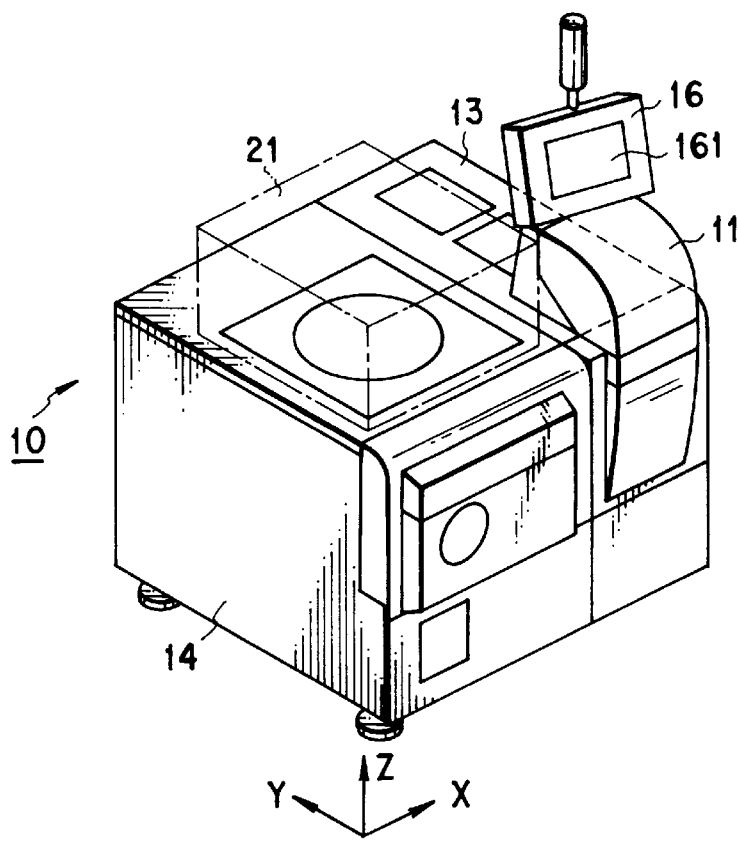
FIG. 1 is a perspective view schematically showing the outer appearance of a probe inspection apparatus according to an embodiment of the present invention.
Figure 2:
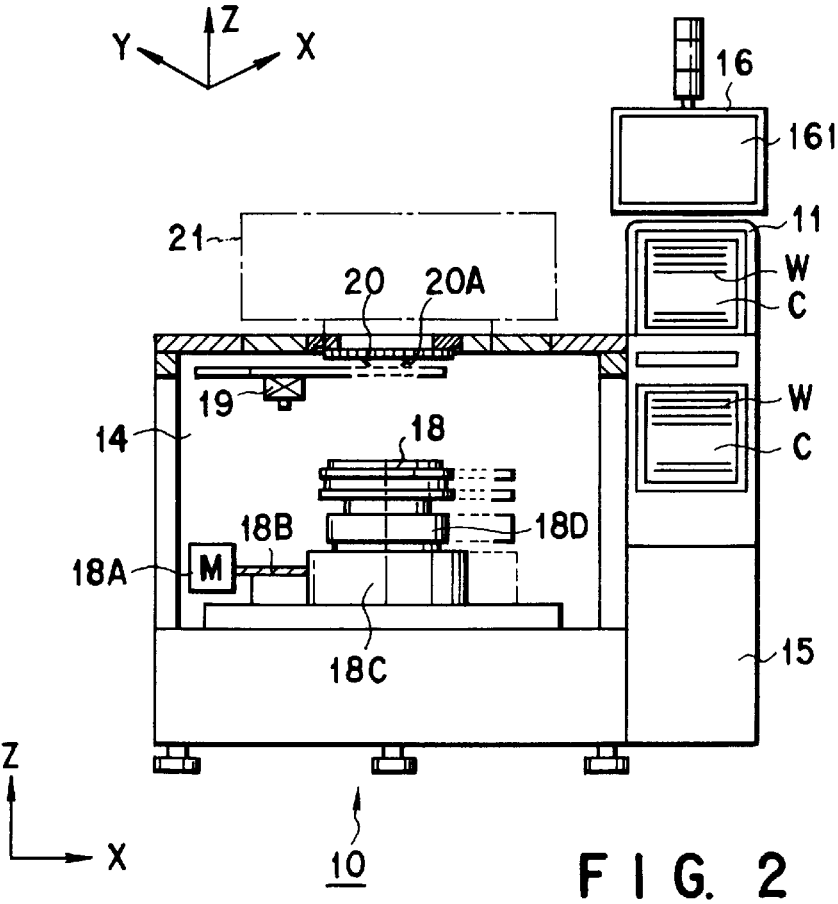
FIG. 2 is a partial sectional view schematically showing the prober section of the probe inspection apparatus.

As shown in FIGS. 1 to 3, a probe inspection apparatus 10 comprises a cassette mounting section 11 mounting or supporting two cassettes C each storing a plurality of semiconductor wafers W formed with semiconductor elements such as IC chips which are horizontally arranged at predetermined intervals therebetween in the vertical direction, a loader section 13 having tweezers 12 serving as a convey mechanism for conveying the semiconductor wafers W from/into the cassettes C mounted on the mounting section 11, a prober section 14 for inspecting the semiconductor wafers W conveyed by the tweezers 12 of the loader section 13, a controller 15 for controlling the movements of various mechanisms and members of these sections 11, 13, and 14, and a display unit 16 having a display panel 161 on which various windows including an operation panel or window for operating the controller 15 are displayed. The display unit 16 comprises an image formation means constituted by known image formation elements such as a CPU, a drive circuit, and a memory in order to display an operation panel and various mode panels (to be described later) on the display panel.

A window showing the state in a given section, e.g., the prober section 14, picked up by, e.g., a CCD camera, and the operation panel are displayed on the display panel 161, and can be switched. A touch or operation key is displayed at a portion of the window displayed on the display panel 161. For example, the display window can be switched from a pickup image display window to an operation panel display window by touching the operation key. In the following description, reference numeral 161 commonly denotes the display panel and the operation panel displayed on this display panel for illustrative convenience.

The display windows of various modes including a window display mode, an operation display mode, and an error display mode are displayed on the display panel 161, and each window has a window code number. Each window is stored in a storage device arranged in the controller or the display unit and displayed on the display panel 161 in accordance with a predetermined program. In the window display mode, the data file of, e.g., the inspection result of semiconductor wafers is read out and displayed on the display panel 161. The window code of this window is stored in a history file. Also in the operation or error display mode, the operation history of the operation key or an error history is stored in the history file. With this processing, the operation history of the operation key and the error history can be appropriately read out from the memory in maintenance or the like, and displayed on the display panel to allow the operator to confirm the contents.

In the operation display mode, as shown in FIGS. 4A to 4C, N various operation or touch keys are displayed on the display panel 161 (of the N operation keys, only keys 161A and 161N are illustrated at upper left and lower right portions for illustrative convenience). Although an operation content (e.g. "START" in FIG. 4A) is shown in a lower portion or common space 161B of the panel 161, in these figures, the operation content is not displayed until any identification key is touched as described later. By touching the operation key 161A, the operator can switch the display window to a next window and/or operate the probe inspection apparatus 10.

The upper left operation key 161A on the display panel 161 is used, e.g., to start predetermined processing, as shown in FIGS. 4A to 4C. The operator touches the operation key 161A to start the processing. In this case, if the user country of the probe inspection apparatus 10 is Japan, "start" is displayed in Japanese on the rectangular key window of the operation key 161A (see FIG. 4A). If the user country is in the English-speaking zone, "start" is displayed in English on the key window of the operation key 161A (see FIG. 4B). If the user country is Korea, "start" is displayed in the Hankul alphabet on the key window of the operation key 161A (see FIG. 4C). In this manner, the operator in the user country of this apparatus can understand that the upper left operation key 161A is a start operation key for starting processing. Similarly, the user country language is employed to display the operation contents of the operation keys for performing operations different from that of the operation key 161A on their rectangular key windows.

As shown in FIGS. 4A to 4C, identification symbol or touch keys S1 corresponding to the operation contents of the various operation keys are displayed together with the operation keys on the display panel 161 of the probe inspection apparatus 10. FIGS. 4A to 4C show only an identification symbol key S1 corresponding to the upper left operation key 161A and an identification symbol key Sn corresponding to the lower right operation key 161N. The key display characters S1 and Sn are displayed on the circular key windows of the touch keys. When the operator (mainly, maintenance person of the shipping country) touches one (e.g., the key S1) of these identification symbol keys, a common space 161B opens at the lower edge portion of the display panel 161. The operation content of the operation key 161A is displayed in the common space 161B in a language different from the user country language, e.g., the language of the manufacture country of this apparatus. As a result, when the user country is different from the shipping country, and the maintenance person of the shipping country performs the maintenance of this apparatus in its user country, or various errors have occurred in this apparatus, the maintenance person can easily, quickly confirm the operation content of the operation key 161A through the identification symbol key S1 to operate the operation key 161A even if the maintenance person cannot understand the user country language. When an error occurs in this apparatus, specific operation and identification symbol keys are displayed. By touching these keys, the operation history of the operation key, an error history, or the like is displayed in symbol. The maintenance person can read these symbols to rapidly take an error measure.

In addition, if the operator touches each of the identification symbol keys displayed on the display panel 161 in correspondence with the many operation keys, a detailed description of the operation content of the operation key corresponding to the operated identification symbol key can be displayed in the user country language and/or the shipping country language in the common space 161B. As a result, the maintenance person can understand the details of the respective operation key contents.

For example, when the shipping country of the probe inspection apparatus is Japan, and the user country is in the English-speaking zone, the operation content "start" of the operation key 161A is displayed in English as the user country language at the operation key 161A and when the symbol key S1 is touched, the operation content is displayed in Japanese in the common space 161B, as shown in FIG. 4B. When the shipping country of the probe inspection apparatus is Japan, and the user country is Korea, the operation content "start" of the operation key 161A is displayed in the Hankul alphabet as the user country language at the operation key 161A and upon the touch of the key S1, the content is displayed in Japanese in the common space 161B, as shown in FIG. 4C. Therefore, even if the operator cannot understand the meaning of "start" in the Hankul alphabet, the maintenance person can read "start" in Japanese displayed in the common space 161B to easily, rapidly confirm the operation content of the operation key 161A.

To obtain a more detailed operation content of the operation key, the corresponding identification symbol key is further operated to display the detailed description in a desired language.

Figure 5:
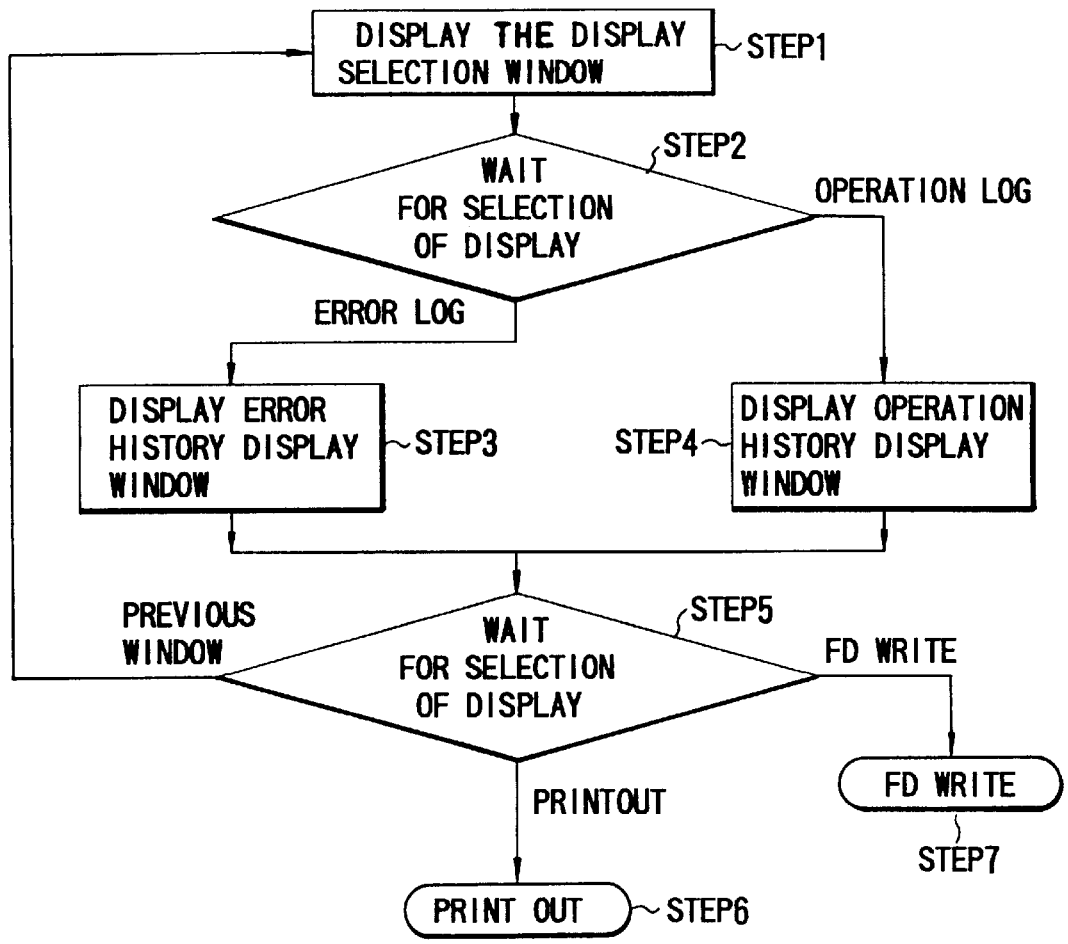
FIG. 5 is a flow chart of a program for displaying an error display mode on the display panel.

Next, the operation of confirming the operation and error histories of the probe inspection apparatus 10 using the window and error display modes displayed on the display panel 161 will be described with reference to FIGS. 5 and 6.

The error display mode is used to confirm the error history in maintenance or the like. In the error display mode, the error content and history are displayed on the display panel 161 in accordance with a flow chart shown in FIG. 5. If the user country of the probe inspection apparatus 10 is Korea, the error history is displayed in the Hankul alphabet to allow the operator to confirm it. If the operator (maintenance person) cannot understand the Hankul alphabet, the operator can operate the identification symbol keys S1 to Sn assigned the operation contents of the various operation keys 161A to 161N displayed on the error display mode window to confirm the operation contents in every operation. The operator can easily, rapidly confirm the error contents and error history on the display panel 161. If the operator operates an operation key for selecting the error display mode on the operation panel, a display selection window or panel shown in FIG. 6 is displayed on the display panel 161. On a display selection window "loader status", "stage status", "option status", "operation log", "error log", and "VT log" are displayed as the operation contents of the operation keys. The respective identification symbol keys are represented by ○ at the lower right portions of these operation keys. On an error history display window shown in FIG. 7, "next page", "print", and "FD write", are displayed as the operation contents of the operation keys, similar to "previous window". The respective identification symbol keys are represented by ○ at the lower right portions of these operation keys.

An actual operation will be explained below with reference to the flow chart shown in FIG. 5.

Figure 6:
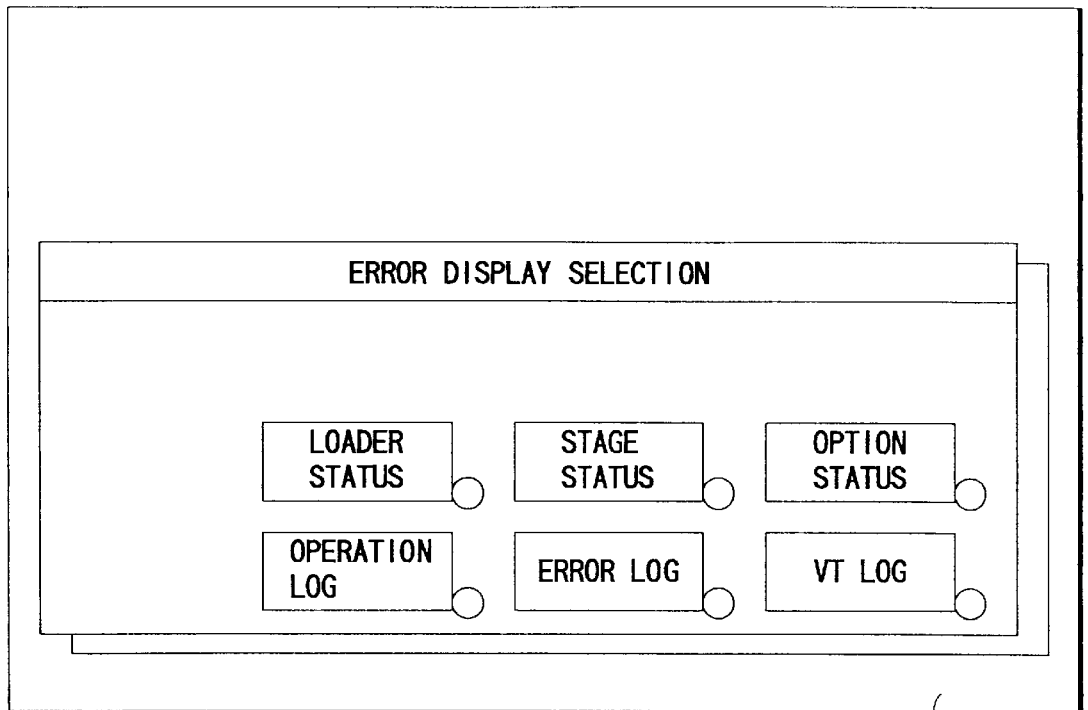
FIG. 6 is a view showing a display selection window displayed on the display panel.
Figure 7:
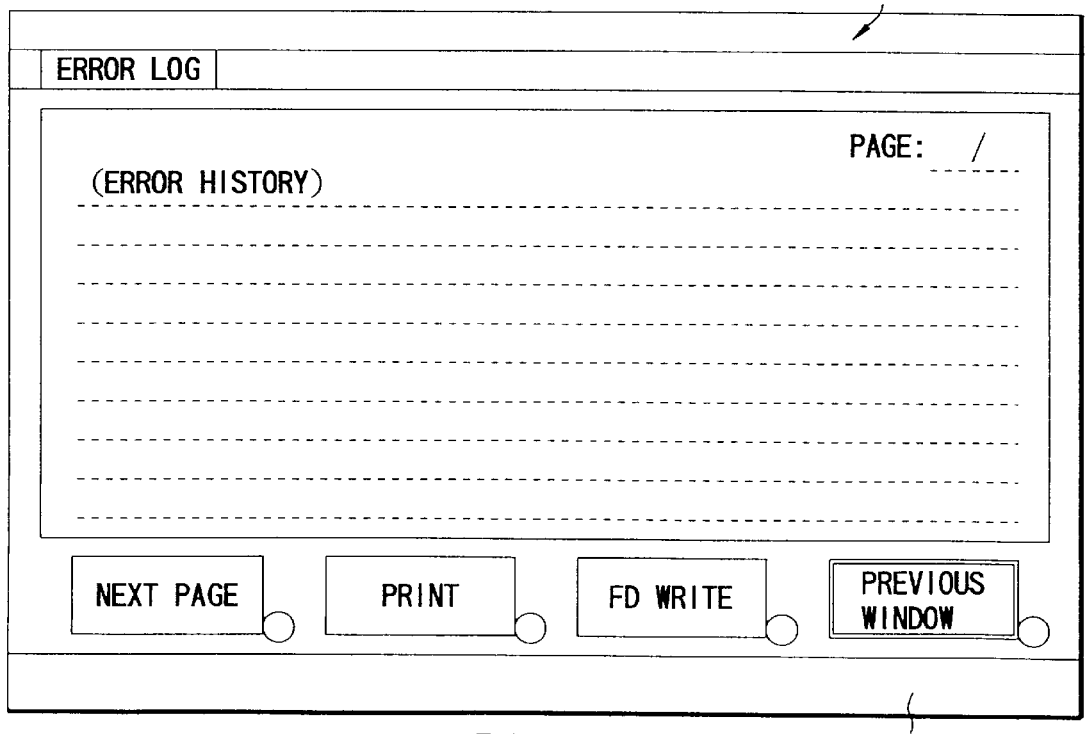
FIG. 7 is a view showing an error history display window displayed on the display panel.

The display selection window is displayed on the display panel 161, as shown in FIG. 6 (step 1). If the operators wants to display the error history, the operator touches the operation key "error log" displayed on this window (step 2). As a result, the error code is read out from the history file, and the error history display window shown in FIG. 7 is displayed on the display panel 161. From this window, the operator can obtain the error occurrence date and hour, the error content, and the like at once (step 3). FIG. 7 shows only the format of the error history display window, and a detailed error content is omitted. On the other hand, when the operator wants to display the operation history in display selection of step 2, the operator touches the displayed operation key "operation log" in FIG. 6 to read out the operation code from the history file and display the content on the display panel 161 in accordance with the display contents in FIG. 7 (step 4).

The flow waits for operator's selection of processing on the window shown in FIG. 7 (step 5). If the operator wants to end the error history display mode or operation history display mode and return to the previous window, the operator touches an operation key corresponding to the previous window. Then, the flow returns to step 1, the display selection window is displayed on the display panel 161, and the flow waits for selection of display in step 2.

This history can be printed out by the printer by touching the operation key "print" displayed on the window shown in FIG. 7 (step 6), or saved in a floppy disk by touching the key "FD write" displayed on the error history display window (step 7). The operator can grasp the past operation history, rapidly check an error, and rapidly take an error measure.

A description of an operation when the operator operates the operation keys representing "loader state", "stage state", and "option state" on the window shown in FIG. 6, and that of an operation when the operator touches the operation key representing "next page" on the window shown in FIG. 7 are omitted.

When the operator wants to confirm the operation history, the history file is read out through the controller by touching of the operation log key, and the operation history is displayed as an identification symbol key as a common symbol or in an international common language such as English or a language of the shipping country. Therefore, the operator can always grasp the operation history of the probe inspection apparatus 10 regardless of the user country language. The history can be printed out by the printer, and the operator can grasp the past operation history and perform maintenance with reference to it.

As has been described above, according to this embodiment, the various operation keys 161A to 161N and the identification symbol keys S1 to Sn corresponding to them are displayed on the window or panel displayed on the display panel 161. When the operator operates a given identification symbol key, its operation content is displayed in a language different from the user country language in the common space 161B at the lower edge portion of this window. A more detailed operation content is displayed in a desired language, as needed. As a result, for example, when the Japanese operator wants to confirm the error content of the probe inspection apparatus 10 in use in another country, the operator operates a given identification symbol key to understand the content of the corresponding operation key.

The operator can easily and rapidly operate the key to easily confirm the error content. Therefore, this probe inspection apparatus requires no comparison table in the Hankul alphabet and Japanese, unlike in the conventional probe apparatus, and a maintenance measure such as an error measure can be immediately taken.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A probe inspection apparatus comprising:

a mounting section mounting an inspection target;

a loader section having a convey mechanism for conveying said inspection target on said mounting section;

a prober section for inspecting said inspection target conveyed by said convey mechanism;

a controller for controlling movements of said prober section and said loader section; and a display unit having a display panel and means for displaying an operation panel for operating said controller on the display panel, the operation panel having at least one operation touch key for operating said controller, said touch key having an operation content displayed in a user country language, and an identification symbol touch key corresponding to the operation key for displaying the operation content on the operation panel in another country language.

2. A probe inspection apparatus comprising:

a mounting section mounting an inspection target;

a loader section having a convey mechanism for conveying said inspection target on said mounting section;

a prober section for inspecting said inspection target conveyed by said convey mechanism;

a controller for controlling movements of said prober section and said loader section; and a display unit having a display panel and means for displaying an operation panel for operating said controller on the display panel, the operation panel having at least one operation touch key for operating said controller, said touch key having an operation content displayed in a user country language, and an identification symbol touch key for displaying the operation content corresponding to the operation key in a language different from the user country language.

3. An apparatus according to claim 2, wherein the operation panel displayed on the display panel comprises a plurality of operation touch keys with displayed different operation contents, identification symbol touch keys respectively for displaying operation contents corresponding to the operation keys in a language different from the language, and a common space for displaying the operation content of any operated identification symbol touch key.

4. An apparatus according to claim 2, wherein the identification symbol touch key causes the operation panel to display a detailed description of the operation content of the operation touch key.

5. An apparatus according to claim 2, wherein, when an error occurs in said probe inspection apparatus, a corresponding window is displayed on the display panel, and a plurality of operation touch keys with displayed different operation contents, and identification symbol touch keys respectively for displaying operation contents corresponding to the operation keys in a language different from the language are displayed on the window.

6. An apparatus according to claim 2, wherein an operation status of each of said mounting section, said loader section, and said prober section is displayed on a display window.

7. An apparatus according to claim 2, wherein the operation content displayed at the operation touch key is displayed in English (Hankul alphabet for Korea Application), and the operation content displayed by the identification symbol touch key is displayed in Japanese.

* * * * *